Dec. 25, 1962 R. J. FARBER 3,070,750

LINEAR DETECTOR CIRCUIT

Filed May 12, 1961

United States Patent Office 3,070,750
Patented Dec. 25, 1962

3,070,750
LINEAR DETECTOR CIRCUIT

Richard J. Farber, New Hyde Park, N.Y., assignor to Hazeltine Research, Inc., a corporation of Illinois Filed May 12, 1961, Ser. No. 109,647
6 Claims. (Cl. 329—169)

Figure 1:
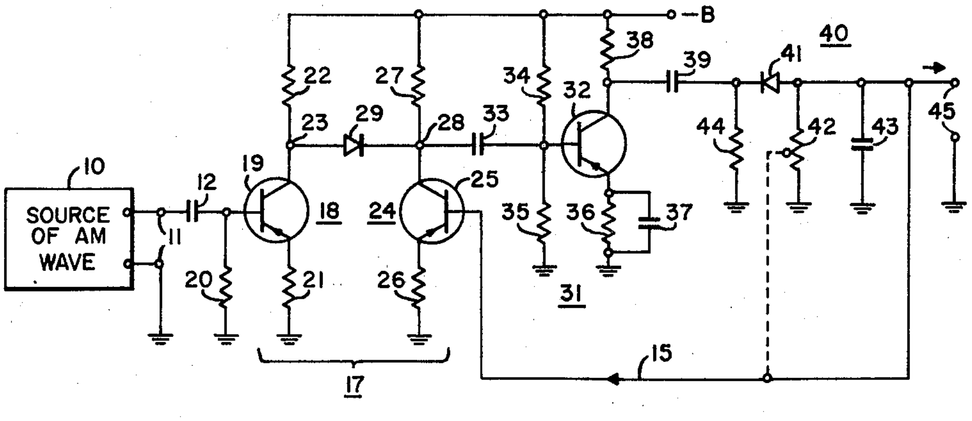
Figure 2A:
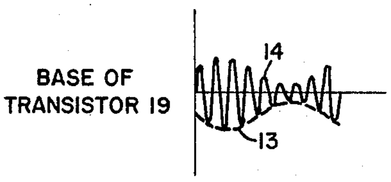

This invention relates to a detector circuit capable of linearly detecting the amplitude modulation of a wave signal.

With certain applications it is necessary to detect, without any distortion, the amplitude-modulation components of a carrier-wave signal, even though the strength of the carrier-wave signal may vary over a wide range from very high to very low strengths. The nonlinear detection characteristic of a conventional diode detector circuit prevents its use in this type of a situation since, although it is linear on high strength signals, it becomes nonlinear on the low strength signals. Furthermore, a conventional detector cannot be used preceded by an amplifier circuit, since the range of signal strengths can be such that the detector would be driven into saturation on dynamic variations in strength.

It is, therefore, an object of the present invention to provide a linear detector circuit capable of reproducing the amplitude modulation of a low-level carrier-wave signal without significant distortion, as well as high-level carrier-wave signals.

In accordance with the present invention, a linear detector circuit comprises first means for supplying a wave signal having an amplitude component to be detected and second means for supplying a control signal hereinafter defined. The circuit also includes signal-comparison means, including a pair of circuits with matched signal-translating characteristics, each circuit being responsive to one of the above signals for comparing the amplitude of the control signal with that of the amplitude component to produce an error signal representative of any differential therebetween. The detector circuit of the invention finally includes output means including a conventional detector circuit responsive to the error signal for deriving an output signal, at least a portion of which is used as the aforementioned control signal for comparison with the amplitude component of the input signal, the amplitude of the output signal thereby being maintained in linear relationship to that of the amplitude component of the input signal.

For a better understanding of the present invention, together with other and further objects thereof, reference is had to the following description, taken in connection with the accompanying drawings, and its scope will be pointed out in the appended claims.

Referring to the drawings:

FIG. 1 is a circuit diagram of a linear detector circuit constructed in accordance with the teachings of the present invention, and FIGS. 2*a*, 2*b* and 3*a* and 3*b* are signal diagrams useful in explaining the operation of the invention.

In the linear detector circuit of FIG. 1 there is provided first means, including source 10, input terminals 11, and coupling capacitor 12, for supplying a wave signal having an amplitude component to be detected. This amplitude component may, for example, be the zero-to-peak magnitude, i.e., the envelope 13, of the wave signal 14 shown in FIG. 2*a*. There is also provided second means, such as feedback line 15, for supplying a control signal 16 shown in FIG. 3*a*, that is essentially a variable D.-C. potential, the amplitude of which is to be compared to the aforementioned envelope 13 of wave signal 14.

The linear detector of FIG. 1 also includes signal-comparison apparatus 17, in which there is provided a pair of circuits having matched signal-translating characteristics for comparing the amplitude of control signal 16 with the amplitude of envelope 13 to produce an error signal representative of any difference therebetween. More specifically, apparatus 17 includes a first transistor amplifier circuit 18 having a signal-translating characteristic determined by the characteristics of transistor 19 and by an amount of degeneration produced by emitter resistor 21. Transistor 19 is biased for class B operation by base resistor 20. That is to say, it conducts on the negative half cycles of signal 14 to reproduce, in a positive-going direction, that same half of signal 14 along with envelope 13 across collector load resistor 22. Apparatus 17 also includes a second transistor amplifier circuit 24 having a signal-translating characteristic matched to that of circuit 18. To this end, transistor 25 preferably has characteristics as nearly like those of transistor 19 as possible. In addition, the value of emitter resistor 26 is selected to match that of resistor 21 before inserting them into circuits 18 and 24. Also, collector resistor 27 preferably has the same value as that of collector resistor 22.

It will be appreciated that transistors have a nonlinear characteristic at low current-conducting levels and, therefore, circuit 18 inherently has a nonlinear signal-translating characteristic. However, as will be seen, this will have no adverse effect on the linearity of the over-all detector circuit, so long as the amount of nonlinearity of circuit 18 is substantially matched by the nonlinear signal-translating characteristic of circuit 24. The collector terminals 23 and 28 of the matched circuits 18 and 24, respectively, are intercoupled by diode 29, which is poled to conduct when the peak of the wave signal at terminal 23 rises above the D.-C. voltage at the terminal 28, thereby producing the aforementioned error signal representative of the differential in amplitude between the wave signal envelope 13 and the amplitude of the control signal 16.

The linear detector circuit of the invention also is provided with means, including a detector circuit 40, responsive to the error signal for deriving therefrom an output signal at output terminals 45, at least a portion of which is used as the aforementioned control signal 16, the amplitude of the output signal thereby being maintained in linear relationship to that of envelope 13 in wave signal 14. Error signal detector circuit 40 is a conventional peak detector circuit, and it may be coupled to terminal 28 of the signal-comparison apparatus 17 by an amplifier circuit 31, also of conventional construction. Circuit 31 preferably has a high degree of gain and its signal-translating characteristic may have a degree of nonlinearity as is normally found in amplifiers without significantly upsetting the linearity of the over-all detector circuit of this invention. The error signal at terminal 28 is coupled to the base of amplifier transistor 32 by a coupling capacitor 33; while resistors 34, 35 form a voltage divider circuit, preferably biasing transistor 32 at maximum gain. The emitter bias is developed across parallel resistor-capacitor network 36, 37. The amplified error signal appearing across collector load resistor 38 is coupled to detector 40 by capacitor 39. Detector 40 includes a single diode 41, poled to produce a negative voltage across load resistor 42. Cpacitor 43 serves to provide a desired time constant in the diode load circuit, while resistor 44, since it serves merely to provide a D.-C. return path in the detector circuit, could, if so desired, be an inductor. It will be appreciated that the choice of detection polarity in detector 40 is determined by the polarity of wave signal 14 that is to be detected, so that control signal 16 will vary with the same polarity at the base of transistor 25 as the envelope 13 at the base of transistor 19.

Figure 2B:
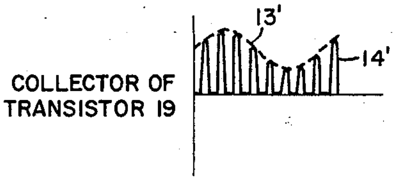

In operation, signal 14 is applied to the base of transistor 19 and causes the transistor to conduct on the negative half cycles thereof so that a positive version of these negative half cycles is reproduced in amplified form at collector terminal 23, as shown by signal 14' in FIG. 2*b*. Similarly, the control signal 16, which is assumed initially to be merely a D.-C. potential, causes transistor 25 to conduct and produce a D.-C. potential at collector terminal 28. Due to the matched characteristics of the two circuits 18 and 24, this D.-C. potential at terminal 28 is the same potential as would be produced at terminal 23 if control signal 16 were applied to the base of transistor 19. Stated another way, if the negative peak swing of signal 14 is equal to the amplitude of control signal 16, then the positive peak swing of signal 14', at collector terminal 23, will be equal to the D.-C. potential produced at collector terminal 28. This being the case, diode 29 remains nonconductive, and no error signal is translated to the following circuits.

Figure 3A:
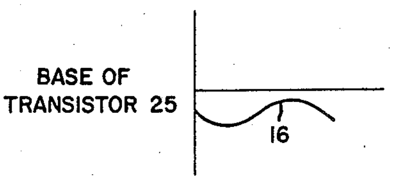
Figure 3B:
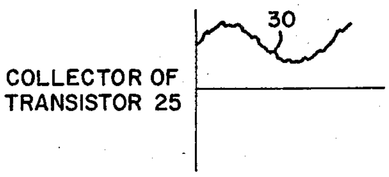

If, however, the peak swing of signal 14 is greater than the amplitude of control signal 16, then the corresponding peak swing of signal 14' will cause diode 29 to become conductive and produce a signal pulse at terminal 28, constituting the error signal which is then amplified in circuit 31 and detected in detector circuit 40. This detected signal is fed back by line 15 to the base of transistor 25 to correct the D.-C. potential at terminal 28 to match the peak swing occurring at terminal 23. On a dynamic basis, the control signal on line 15 is shown in FIG. 3*a* and the corresponding signal 30, at terminal 28, is shown in FIG. 3*b*, wherein the ripple represents the error signal coupled through capacitor 33 to the following circuits. In practice, resistor 42, which constitutes a D.-C. connection from the base of transistor 25 to ground, produces a constant tendency to discharge the capacitor 43 across which the output signal has been developed. Therefore, the system constantly operates with a small error signal, i.e., ripple, on signal 30 so that the charge across the capacitor is constantly being replenished.

It will be appreciated that output signals at terminal 28 may be proportioned greater than the magnitude of the peak signal swing of wave signal 14 by connecting line 15 to a tap on resistor 42, as shown by the dotted line in FIG. 1. Also, while a negative voltage is developed across resistor 42, a positive voltage appears across resistor 44. Therefore, if resistors 42 and 44 are made equal, equal and opposite output signals can be had as desired.

While applicant does not wish to be limited to any particular set of circuit constants, the following have proved useful in the detector circuit of FIG. 1:

| | |
|---|---|
| Resistors **21** and **26**____________________ohms__ | 225 |
| Resistors **20**, **36**, and **44**______________kilohm__ | 1 |
| Resistors **22**, **27**, anl **34**_____________kilohms__ | 10 |
| Resistors **35** and **38**____________________do____ | 2.2 |
| Resistor **42**____________________________do____ | 3.9 |
| Capacitors **12** and **33**____________microfarad__ | 0.05 |
| Capacitors **37** and **39**__________________do____ | 0.1 |
| Capacitor **43**_________________microfarads__ | 5 |
| Diodes **29** and **41**____________________________ | 1N295 |
| Transistors **19**, **25**, and **32**____________________ | 2N414 |
| Frequency of carrier-wave singal **14**__kilocycles__ | 70 |

While there has been described what is, at present, considered to be the preferred embodiment of this invention, it will be obvious to those skilled in the art that various changes and modifications may be made therein without departing from the invention, and it is, therefore, aimed to cover all such changes and modifications as fall within the true spirit and scope of the invention.

What is claimed is:

1. A linear detector circuit comprising: first means for supplying a wave signal having an amplitude component to be detected; second means for supplying a control signal hereinafter defined; signal-comparison means, including a pair of circuits with matched signal-translating characteristics, each circuit being responsive to one of said signals for comparing the amplitude of said control signal with that of said amplitude component to produce an error signal representative of any differential therebetween; and output means including a detector circuit responsive to said error signal for deriving an output signal, at least a portion of which is used as said control signal for comparison with said amplitude component, the amplitude of said output signal thereby being maintained in linear relationship to that of said amplitude component.

2. A linear detector circuit comprising: first means for supplying a wave signal having an amplitude component to be detected; second means for supplying a control signal hereinafter defined; signal-comparison means including a first transistor circuit with a nonlinear signal-translating characteristic and a second transistor circuit with a nonlinear signal-translating characteristic matched to that of said first circuit, each circuit being responsive to one of said signals for comparing the amplitude of said control signal with that of said amplitude component to produce an error signal representative of any differential therebetween; and output means including a detector circuit responsive to said error signal for deriving an output signal, at least a portion of which is used as said control signal for comparison with said amplitude component, the amplitude of said output signal thereby being maintained in linear relationship to that of said amplitude component.

3. A linear detector circuit comprising: first means for supplying a wave signal having an amplitude component to be detected; second means for supplying a control signal hereinafter defined; signal-comparison means, including a pair of circuits with matched signal-translating characteristics, each circuit being responsive to one of said signals for comparing the amplitude of said control signal with that of said amplitude component to produce an error signal representative of any differential therebetween; and output means including a detector circuit coupled to said signal-comparison means through an amplifier circuit and being responsive to said error signal for deriving an output signal, at least a portion of which is used as said control signal for comparison with said amplitude component, the amplitude of said output signal thereby being maintained in linear relationship to that of said amplitude component.

4. A linear detector circuit comprising: first means for supplying a wave signal having an amplitude component to be detected; second means for supplying a control signal hereinafter defined; signal-comparison means, including a pair of circuits with matched signal-translating characteristics, one of said circuits being adapted to reproduce, at a terminal thereof, a portion of said wave signal including said amplitude component, the other of said circuits being adapted to produce, at a terminal thereof, a potential determined by said control signal, said terminals being intercoupled by a unidirectionally conductive device for comparing effectively the amplitude of said control signal with that of said amplitude component to produce an error signal representative of any differential therebetween; and output means including a detector circuit responsive to said error signal for deriving an output signal, at least a portion of which is used as said control signal for comparison with said amplitude component, the amplitude of said output signal thereby being maintained in linear relationship to that of said amplitude component.

5. A linear detector circuit comprising: first means for supplying a wave signal having an amplitude component to be detected; second means for supplying a control signal hereinafter defined; signal-comparison means, including a first transistor circuit with a nonlinear signal-translating characteristic and a second transistor circuit with a nonlinear signal-translating characteristic matched to that of said first circuit, each circuit being responsive to one of said signals for comparing the amplitude of said control signal with that of said amplitude component to produce an error signal representative of any differential therebetween; and output means including a detector circuit coupled to said signal-comparison means through an amplifier circuit and being responsive to said error signal for deriving an output signal, at least a portion of which is used as said control signal for comparison with said amplitude component, the amplitude of said output signal thereby being maintained in linear relationship to that of said amplitude component.

6. A linear detector circuit comprising: first means for supplying a wave signal having an amplitude component to be detected; second means for supplying a control signal hereinafter defined; signal-comparison means, including a pair of circuits with matched signal-translating characteristics, one of said circuits being adapted to reproduce, at a terminal thereof, a portion of said wave signal including said amplitude component, the other of said circuits being adapted to produce, at a terminal thereof, a potential determined by said control signal, said terminals being intercoupled by a unidirectionally conductive device for comparing effectively the amplitude of said control signal with that of said amplitude component to produce an error signal representative of any differential therebetween; and output means including a detector circuit coupled to said signal-comparison means through an amplifier circuit and being responsive to said error signal for deriving an output signal, at least a portion of which is used as said control signal for comparison with said amplitude component, the amplitude of said output signal thereby being maintained in linear relationship to that of said amplitude component.

References Cited in the file of this patent

UNITED STATES PATENTS 2,594,769 Hales ---------------- Apr. 29, 1952
2,946,016 Meyer ---------------- July 19, 1960